United States Patent
Masumoto et al.

(10) Patent No.: US 6,482,730 B1
(45) Date of Patent: Nov. 19, 2002

(54) METHOD FOR MANUFACTURING A SEMICONDUCTOR DEVICE

(75) Inventors: Mutsumi Masumoto, Beppu; Kenji Masumoto, Hiji-machi, both of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/510,084

(22) Filed: Feb. 22, 2000

(30) Foreign Application Priority Data

Feb. 24, 1999 (JP) .......................................... 11-046301

(51) Int. Cl.[7] .............................................. H01L 21/44
(52) U.S. Cl. ....................... 438/617; 438/110; 438/113; 438/613
(58) Field of Search ................................ 438/110, 113, 438/114, 460, 458, 456, 462, 612, 613, 617; 257/738, 698, 778, 782, 784, 786, 789, 791

(56) References Cited

U.S. PATENT DOCUMENTS

| | | | |
|---|---|---|---|
| 5,925,931 A | * | 7/1999 | Yamamoto ................. 257/737 |
| 5,977,641 A | * | 11/1999 | Takahashi et al. .......... 257/737 |
| 6,075,280 A | * | 6/2000 | Yung et al. ................. 257/620 |
| 6,235,552 B1 | * | 5/2001 | Kwon et al. ................ 438/106 |

FOREIGN PATENT DOCUMENTS

JP 2000068405 A * 3/2000 ........... H01L/23/12

* cited by examiner

Primary Examiner—Trung Dang
Assistant Examiner—Brook Kebede
(74) Attorney, Agent, or Firm—Bret J. Petersen; W. James Brady; Frederick J. Telecky, Jr.

(57) ABSTRACT

A method to improve the resin sealing reliability in the manufacturing of a wafer-level CSP. The method for manufacturing a semiconductor device of the present invention includes a process that forms wiring 14 and conductive supports 16, which electrically connect electrode pads 10a and corresponding external terminals, on a wafer 10 on which semiconductor elements are formed. In subsequent processes, a groove 18 (preferably V shaped) is formed in the surface of the above-mentioned wafer along the boundary lines of the respective semiconductor elements. Next, the end surfaces of the above-mentioned conductive supports 16 are exposed, and the above-mentioned wafer surface is covered with a resin 19 so that external terminals 20 are arranged on the end surfaces of the conductive supports. In the final process, along the boundary lines of the above-mentioned semiconductor elements, packaged semiconductor devices 32 are obtained by dicing the above-mentioned wafer.

16 Claims, 5 Drawing Sheets

METHOD FOR MANUFACTURING A SEMICONDUCTOR DEVICE

FIELD OF THE INVENTION

The present invention pertains to a method for manufacturing a semiconductor device. In particular, it pertains to a method for manufacturing a semiconductor device that can package semiconductor chips in a wafer state.

BACKGROUND OF THE INVENTION

In the manufacturing field of semiconductor devices, there is an ongoing effort to further miniaturize a single packaged semiconductor device. The initial effort to miniaturize semiconductor devices involved the reduction of the dimensions of the semiconductor chips themselves. With the reduction of semiconductor chips, the number of chips, which can be obtained from one wafer is increased, and the manufacturing cost is reduced. At the same time,, since the distance required by the electrons to move between the respective elements can be shortened, the operating speed of the device can be increased. With the development of fine machining technologies, the chip size of semiconductor devices with equivalent functions can be decreased even more. Currently, the most advanced design unit is around 0.25 $\mu$m, and according to the rule, 20 million or more transistors can be formed on one semiconductor chip.

The next effort in miniaturizing semiconductor devices is to produce packages for sealing the semiconductor chips of sizes that are as close as possible to the sizes of the semiconductor chips being housed. One actual result of this effort is a semiconductor device called a chip size package (CSP) or a chip scale package. In a chip size package, terminals (hereinafter called external terminals) that connect to a substrate (hereinafter called external substrate), on which a semiconductor device is mounted, are two-dimensionally arranged over the surface of the semiconductor chips so that the chip can be made formed with approximately the same size as the package. In the above-mentioned description, the package size is decreased to make it approximately the same as the semiconductor chip size, so that the mounting area is decreased and the wiring length of chip electrodes and external terminals is shortened. Thereby, similar to the case where the above-mentioned semiconductor chips themselves are reduced, the operating speed of the semiconductor device is improved.

On the other hand, even though the package size is decreased, the manufacturing costs are not considerably lowered. The reason for this is that the package must be processed for each semiconductor chip cut out of the wafer so the number of processes is constant, and even though the package size is decreased, there is no change in productivity.

Under this background, a technology for packaging semiconductor chips in a wafer state (hereinafter called wafer-level CSP) has been proposed, and its practical application has been developed by various companies. Wafer-level CSP is a semiconductor manufacturing technology that packages before each semiconductor chip is cut out of a wafer. In wafer-level CSP, since the package process can be integrated with the wafer process, the packaging costs and the manufacturing costs of the chips can be significantly lowered. For further details of wafer-level CSP, see "Nikkei Microdevice," published by Nikkei BP Co., August 1998, pp. 44–71.

Wafer-level CSP patterns from structures in which the surface of a wafer is covered with a resin similar to the conventional chip size package. However, in this type of semiconductor device, the resin does not cover the sides of the semiconductor chips so the sealing reliability is lower relative to a conventional package. In addition, due to the difference in linear expansion coefficients between the wafer and resin, etc., the resin will often peel away from the interface with the wafer. Also, in such a semiconductor device, a high degree of flatness is required for the surface on the mounting side of the semiconductor chips, thus, the mounting surface requires a planarization process with a favorable yield that is suitable for the semiconductor device with the above-mentioned pattern.

SUMMARY OF THE INVENTION

The method for manufacturing the semiconductor device of the present invention includes the following processes. The method consists of a process that prepares a wafer on which there are several semiconductor elements with corresponding electrode pads exposed on the wafer surface; a process that forms wiring for electrically connecting the above-mentioned electrode pads and corresponding external terminals on the above-mentioned wafer; a process that forms conductive supports at each point of the above-mentioned wiring where the above-mentioned external terminals are arranged; a process that forms a groove (preferably with a V shape) in the surface of the above-mentioned wafer along the boundary lines of the above-mentioned semiconductor elements, exposes at least said groove, which has an opening width that is wider than the width of the dicing cut, and the end surfaces of the above-mentioned conductive supports, and covers the surface of the above-mentioned wafer with a resin; a process that arranges the above-mentioned external terminals on the end surfaces of the above-mentioned exposed conductive supports, and a process that dices the above-mentioned wafer along the boundary lines of the above-mentioned semiconductor elements.

In the process that covers the above-mentioned wafer surface with a resin, the resin also fills the groove formed in the wafer in advance. The wafer is diced at the position of the above-mentioned groove, and the resin in the groove covers part of the side surface of the corresponding diced semiconductor chips. As a result, the sealing reliability of the semiconductor device is improved.

Here, the process for covering the above-mentioned wafer surface with resin preferably also consists of a process that applies and cures the resin to the above-mentioned wafer surface in an approximately flat manner and a process that grinds the surface of the above-mentioned cured resin and exposes the end surfaces of the above-mentioned conductive supports.

With the grinding of the above-mentioned resin, the planarization of the resin surface including the end surfaces of the conductive support is easily achieved.

Also, a process for forming an elastic resin layer is preferably also done to the above-mentioned wafer surface before the process for forming the above-mentioned wiring.

An objective of the present invention is to provide a manufacturing method that improves the resin sealing reliability in a wafer-level CSP semiconductor device.

Another objective of the present invention is to provide a manufacturing method including a planarization process with high precision and favorable yield for a mounting surface in the above-mentioned semiconductor device.

REFERENCE NUMERALS AND SYMBOLS AS SHOWN IN THE DRAWINGS

In the figures, 10 represents a wafer, 10a an electrode pad, 11 a polyimide resin, 12 a barrier metal, 13 a resist, 14 a wiring, 15 a register, 16 a copper bump, 17 a resist, 18 a groove, 19 a package resin, 20 a solder ball, and 32 a semiconductor device.

DESCRIPTION OF THE EMBODIMENTS

Figure 1:
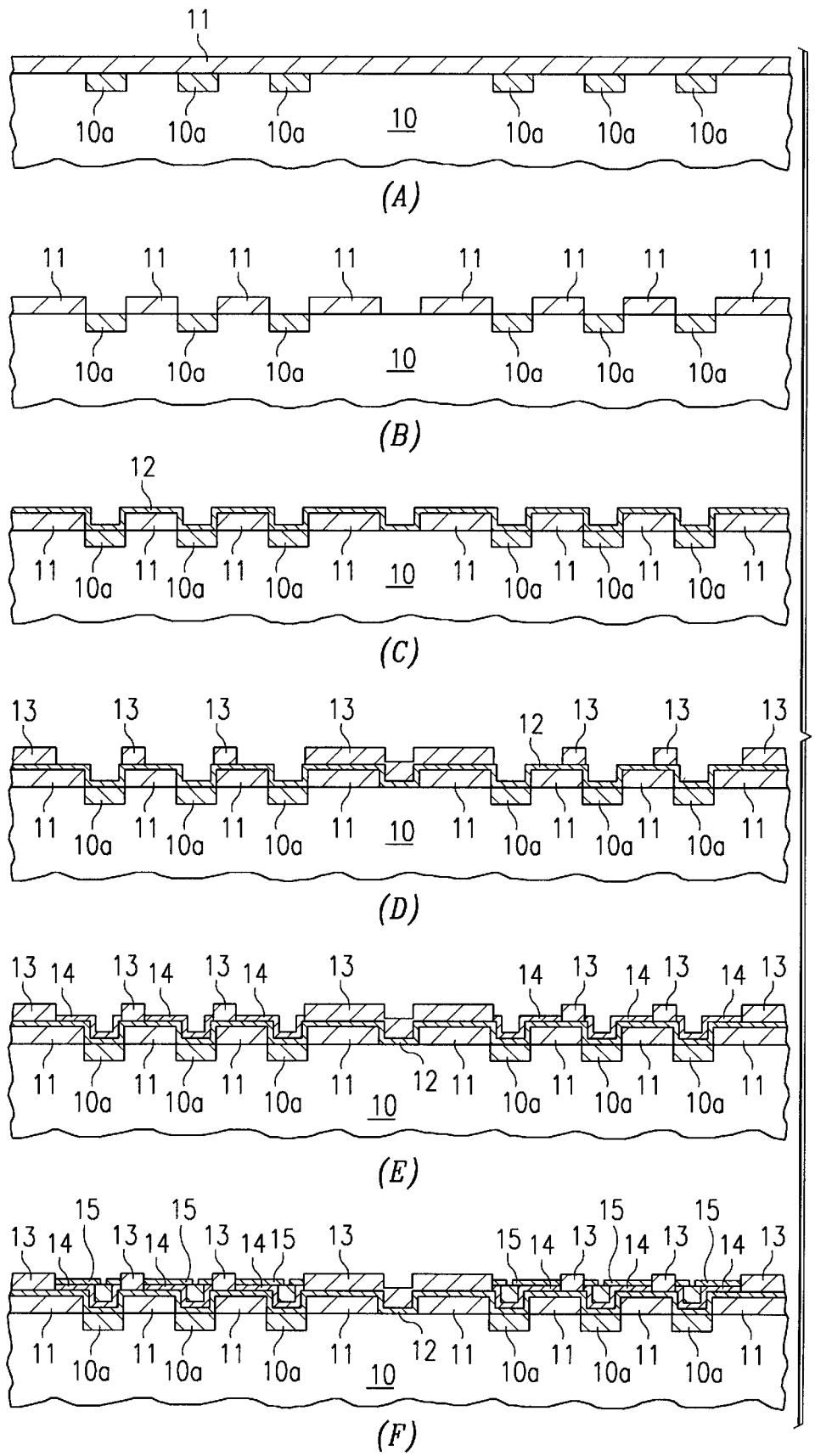
FIG. 1 shows a manufacturing process of the semiconductor device of an embodiment of the present invention.

Next, an embodiment of the present invention is explained with reference to the figures. In the method for manufacturing a semiconductor device of this embodiment, a package is processed as a wafer on which semiconductor elements are formed, and a packaged semiconductor device is finally obtained at the stage where the wafer is diced. The manufacturing method of this embodiment includes a process that forms required wiring on the wafer surface on which the semiconductor elements are formed, a process that forms conductive supports, a process that forms a groove along the boundary lines of the semiconductor elements, a process that seals the wafer surface with a resin, a process that applies solder balls which are used as external terminals, and a process that produces each package by dicing the wafer. These detailed processes are sequentially illustrated in FIGS. 1–3. Also, someone skilled in the art should recognize that these figures are not to scale. Also, in the figures, only a cross section (corresponding to two semiconductor devices) of part of a wafer is shown, however it is easily understood that the following treatments are applied over the entire wafer according to each Prior to the processes shown in the figures, an ordinary wafer process is applied, and semiconductor elements arranged in a matrix shape are formed on the surface of a silicon wafer. Here, one circuit pattern formed on the wafer that corresponds to one semiconductor device is called a semiconductor element. On the wafer surface, several electrode pads for each semiconductor element are exposed, and corresponding electrode pads and external terminals are electrically connected during postprocessing.

In the initial process A of this embodiment, a photosensitive polyimide resin layer 11 is formed on the surface of a wafer 10 on which semiconductor elements are formed in the above-mentioned wafer process. The single layer 11 covers electrode pads 10a over the entire area of the wafer 10. The photosensitive polyimide resin layer 11 covers the surface of the relatively brittle silicon wafer so that impact forces imparted to a completed package from the outside are reduced before they reach the wafer surface. Next, in process B, using a photomask, an area corresponding to the electrode pads 10a and an area along the boundary lines of the semiconductor elements are masked, and the photosensitive polyimide resin is exposed to light, so that the polyimide resin on the above-mentioned areas is etched.

Next, in order to form metallic wiring on the wafer, the processes C–F are performed. Process C uses an ion sputtering method to deposit a titanium tungsten (TiW) layer on the wafer surface, and barrier metals 12 are formed on the surface consisting of chromium (Cr), nickel (Ni), etc. In process D, resists 13 for forming wiring are formed by a photolithography technique. In process E, copper (Cu) is plated on the barrier metals exposed by the resists 13, so that wiring 14 is formed. In process F, titanium tungsten (TiW) is deposited again on the wafer surface by the ion sputtering method, and gold (Au), palladium (Pd), and other noble metals 15, which are difficult to oxidize, are vapor-deposited on the above-mentioned wiring 14.

Figure 2:
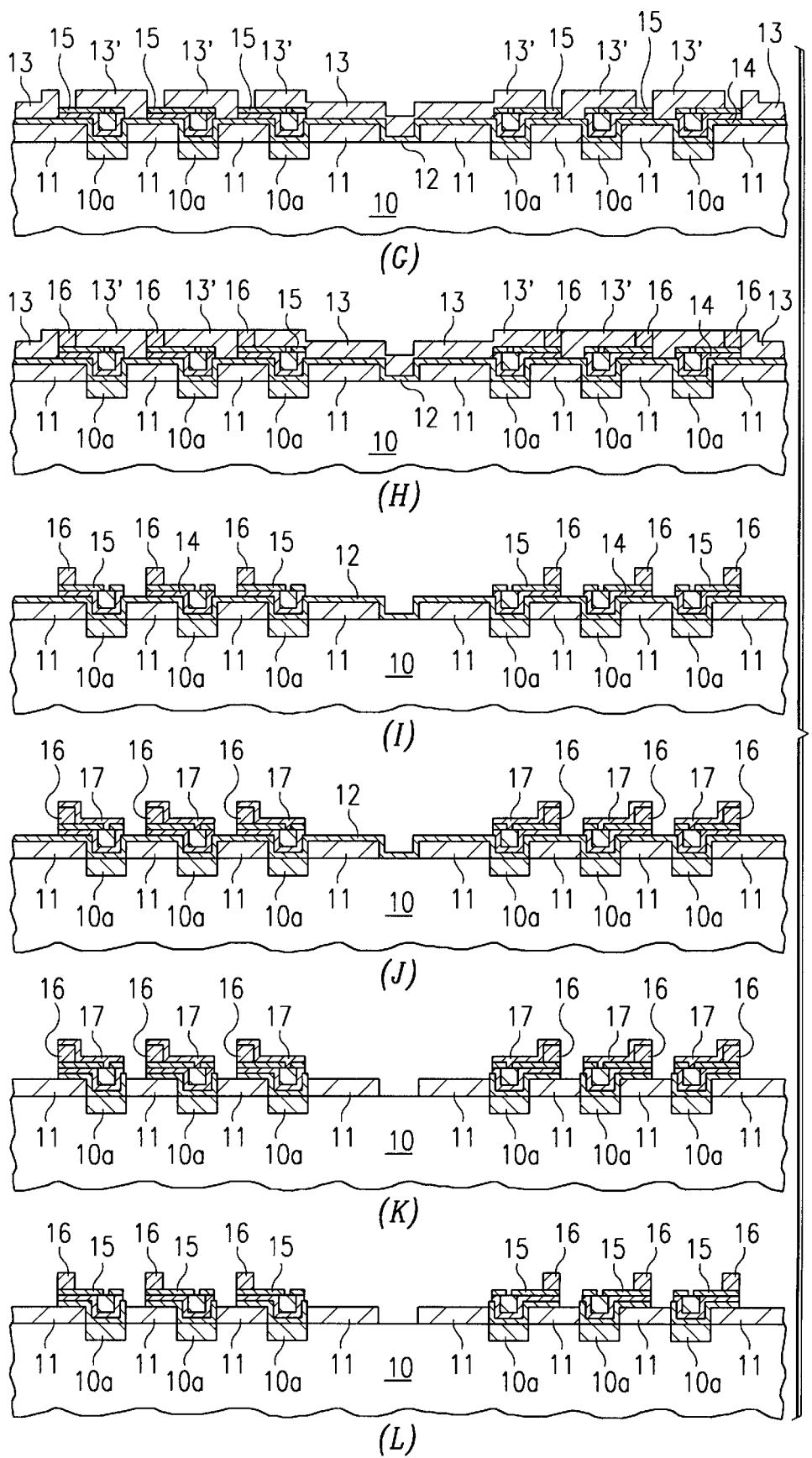
FIG. 2 shows a manufacturing process of the semiconductor device of an embodiment of the present invention.

Next, in order to form copper bumps as conductive supports, the processes G–I shown in FIG. 2 are performed. In process G, resists 13' for forming the copper bumps are superimposed on the previous resists 13 by means of a photolithography technique. In process H, said copper bumps 16 are formed in the spaces next to the wiring 14 that were formed by the resists 13'. In an application example, the copper bumps 16 can be formed by laminating copper (Cu) plating. Next, in process I, the resists 13 and 13' applied in the previous processes D and G are removed. The copper bumps 16 on the wirings 14 are obtained by the above processes.

Next, in order to remove the metallic layer except for the area of the wiring 14, the processes J–L are performed. In process J, resists 17 are formed on the area of the wiring 14, and in process K, the metallic layer on the wafer surface except for the area of the wiring 14 is etched. In the subsequent process L, the resists 17 are removed.

Figure 3:
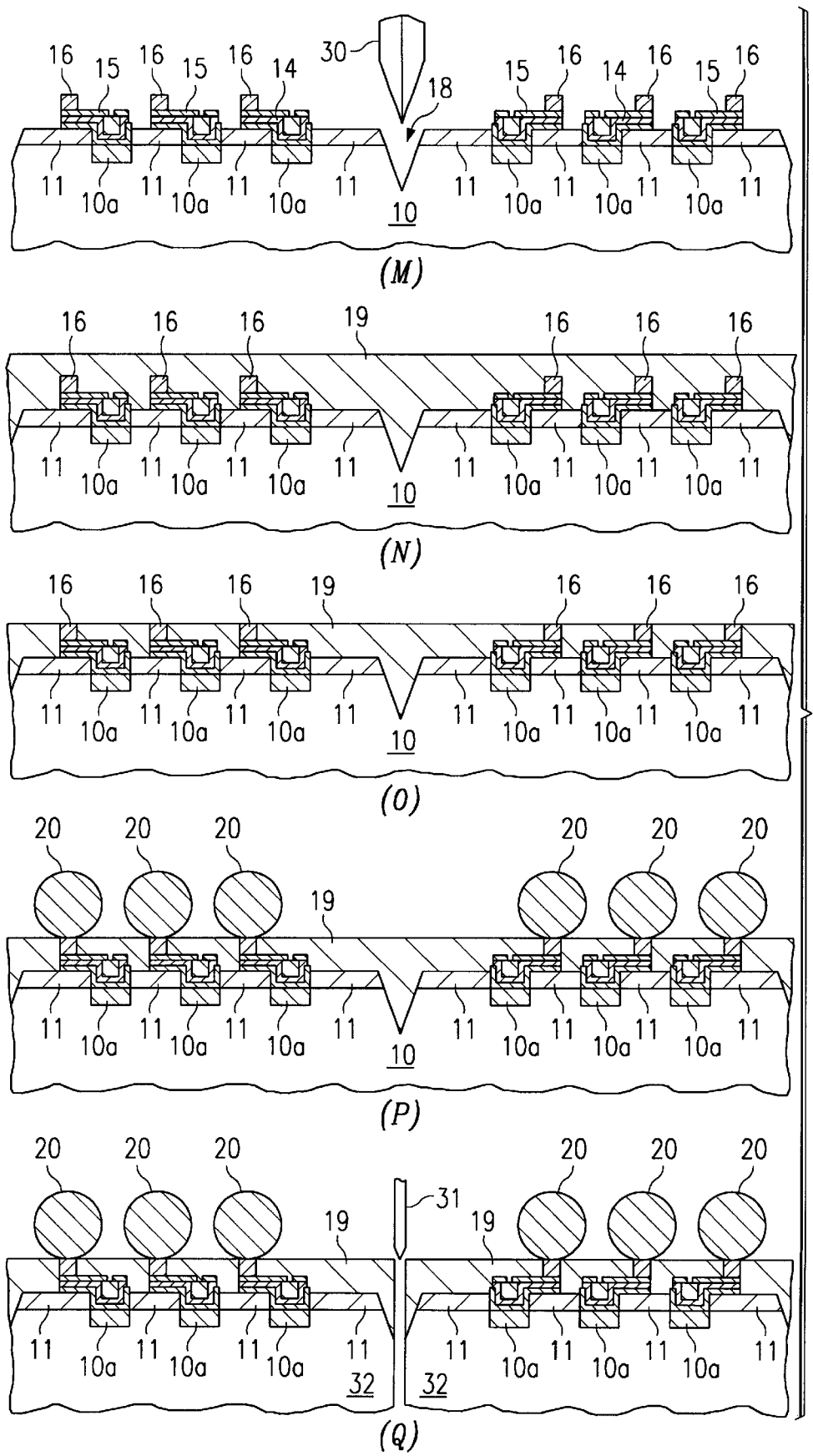
FIG. 3 shows a manufacturing process of the semiconductor device of an embodiment of the present invention.

Next, in process M shown in FIG. 3, a groove 18 with a V shape is formed along the boundary lines of the various semiconductor elements. The groove 18 with a prescribed depth is obtained by controlling a dicing saw 30 with a blade tip of an intended groove shape. The above-mentioned groove 18 is provided such that part of the outer periphery of each semiconductor device that is cut out later is enclosed by the resin in the groove 18. In determining the shape (U shape, semicircular shape, etc.), depth, width, opening angle, etc., of the above-mentioned groove, the questions of whether or not there is an easy formation of the above-mentioned groove, whether or not there is a reliable casting of the package resin, etc., must be considered. In an application example, the groove 18 had a V shape with an opening angle of 30° and a depth of 180 µm. With other similar groove formation conditions, at least the width of the upper part of the above-mentioned groove must be wider than the blade width of the dicing saw that is used to dice the wafer during postprocessing. The reason for this is that parts of the groove and the resin in the groove that are cut out by the dicing saw do not remain on the semiconductor device after dicing of the wafer.

In the next process (N), a resin 19 for a package is applied on the wafer and uniformly spread over the entire area of the wafer surface. The surface height of the uniformly spread resin 19 is higher than the height of the copper bumps 16, and the wiring 14 and the copper bumps 16 on the wafer are completely embedded in the resin 19. In order to apply the package resin 19 to the wafer uniformly, a spin coating method, a screen printing method, or some other resin application methods can be used. In case any of these methods is used, it is necessary to assure that the resin is reliably cast into the above-mentioned groove 18. On the other hand, in case any of these methods is used, as will be seen in the explanation of the postprocessing, the flatness of the surface of the resin 19 is not necessarily very precise.

In the next process O, the surface area of the resin 19 is ground using a grinder or some other grinding machine. It is necessary to perform grinding until the end surfaces of at least all the copper bumps 16 are exposed on the top side. In order to obtain a uniform smooth surface, the copper bumps 16 are formed at a position sufficiently higher than an intended height, and in this process, along with the grinding of the above-mentioned resin 19, preferably, the copper bumps 16 are ground to an intended height. In an application example, the height of the copper bumps 16 after grinding in this process was set to 100 μm.

In the above-mentioned grinding, the surface finishing of the end surface of the exposed copper bumps 16 is especially important. It is necessary to avoid a decrease in the mounting reliability of solder balls, which will be mounted later, due to SAW marks and burrs in the end surfaces. In order to obtain favorable end surfaces of the copper bumps 16, the kind of grinder to be used and the conditions of use are predetermined. In the application example, which used a grinder with a carbide blade and the following conditions, favorable end surfaces without SAW marks and burrs were obtained.

TABLE 1

| | |
|---|---|
| Rotating speed of spindle (rpm) | 3000 |
| Rotating speed of table (rpm) | 300 |
| Feed rate (μm/sec) | 0.2 |
| Amount of grinding water (L/Min) | 5.0 |
| Current value A | 8.9 |

Next, in process (P), solder balls 20, which are used as external terminals and which were prepared in a separate process, are transferred onto the above-mentioned corresponding copper bumps 16 and fixed by means of batch reflow. Finally, in process Q, using a dicing saw 31, the wafer 10 is diced, and packaged semiconductor devices 32 are obtained by means of the above-mentioned processes. Since the dicing is carried out at the center of the groove 18 formed in the previous process, the resin 19 exceeds the thickness of the original resin and reaches the sides of the mounting surface of each semiconductor device 32. Thus, the integration of the chips of the semiconductor devices 32, that is, the silicon substrate and the resin 19 on the mounting surface is increased.

Figure 4:
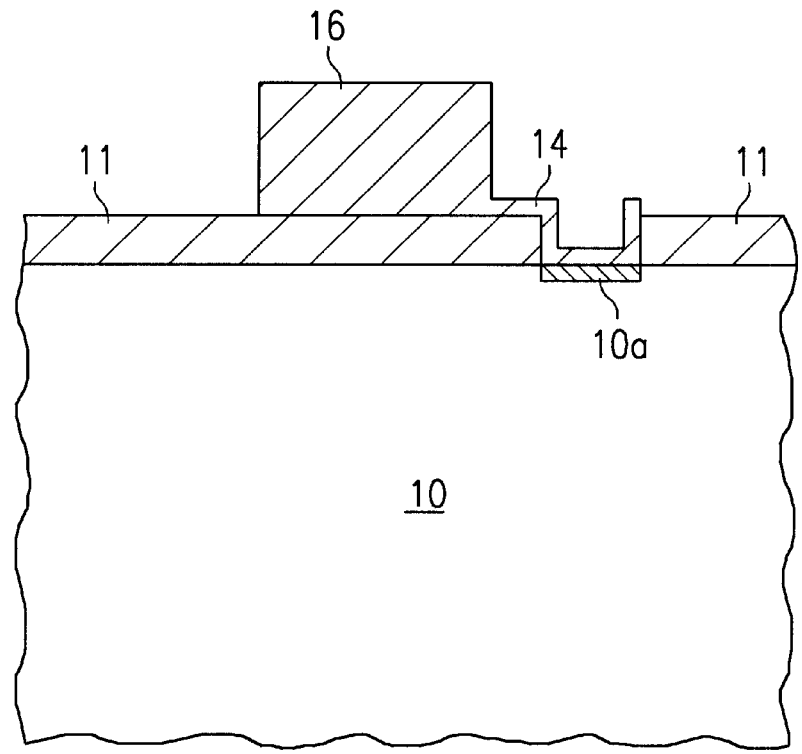
FIG. 4 is an enlarged diagram showing the main parts of process I in FIG. 2.
Figure 5:
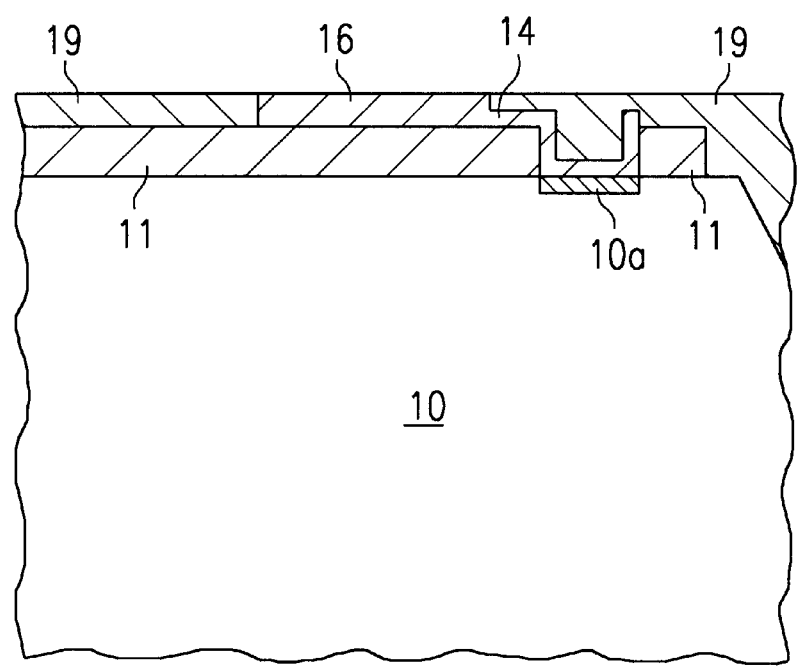
FIG. 5 is an enlarged diagram showing the main parts of process O in FIG. 3.
Figure 6:
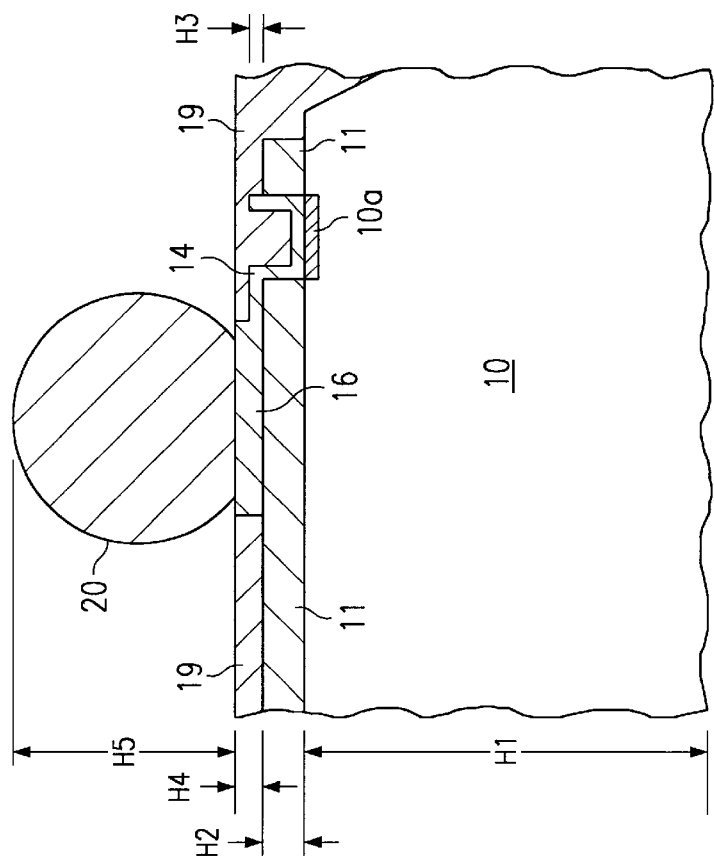
FIG. 6 is an enlarged diagram showing the main parts of process Q in FIG. 3 or the main parts of a completed semiconductor device.

FIGS. 4–6 are partially enlarged diagrams showing the wafer in three processes selected from the above-mentioned manufacturing processes. FIG. 4 is an enlarged diagram showing the main parts of process I in FIG. 2. The figure shows a state in which the polyimide resin 11, wiring 14, and copper bump 16 are respectively formed on the wafer 10. Also, in the figure, the metallic layers formed above and below the wiring 14 in processes C and F are omitted. FIG. 5 is an enlarged diagram showing the main parts of process O in FIG. 3. The figure shows a state in which the applied resin 19 is ground and the surface of the package is formed. FIG. 6 is an enlarged diagram showing the main parts of process Q in FIG. 3, that is, the main parts of the completed semiconductor device 32. The figure shows a state in which the solder ball 20 is fixed onto the copper bump 16. Also, it shows a state in which the outer peripheral part of the chip of the semiconductor device 32 is partially covered with the resin 19. In an application example, the sizes H1–H5 in the figure are 625 μm, 5 μm, 5 μm, 100 μm, and 500 μm, respectively.

Figure 7:
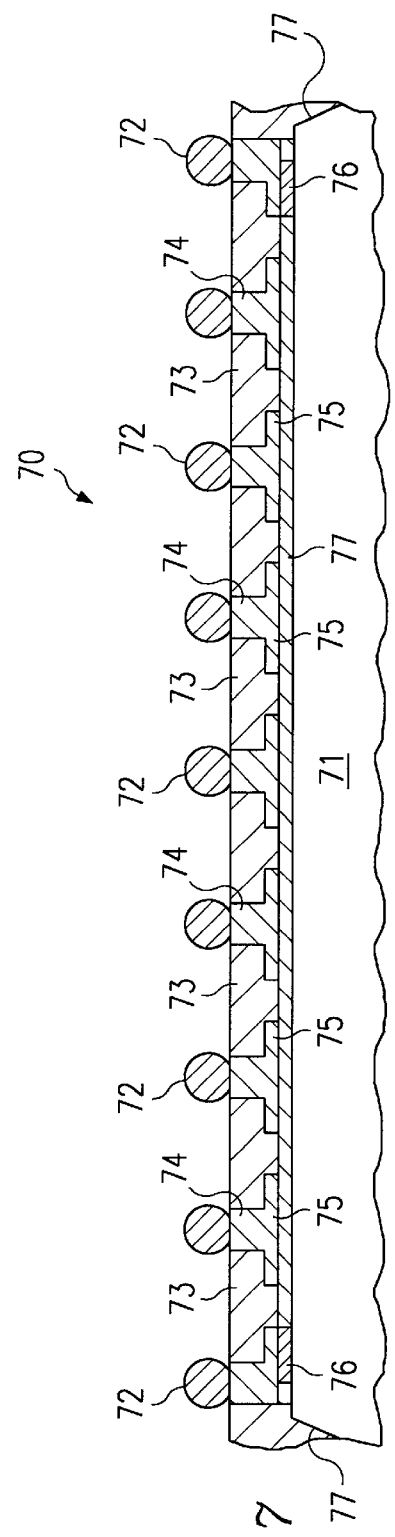
FIG. 7 is an outlined cross section showing the semiconductor device obtained by the manufacturing method of the present invention.

FIG. 7 shows an example of the semiconductor device obtained by the manufacturing method of the present invention. The surface area of a packaged semiconductor device 70 is completely fitted to the planar size of a semiconductor chip 71 that is mounted on the device. On the mounting surface (upper side in the figure) of the semiconductor device 32, there are many solder balls 72 used as external terminals that are arranged in a two-dimensional. Each solder ball 72 is electrically connected to each electrode pad 76 of the semiconductor chip 71 by copper bumps 74 and copper wirings 75 covered with a package resin 73. A part 77 of the mounting surface sides of the semiconductor chip 71 is cut off at an angle, and part of the package resin 73 covers the sides. With the introduction of the resin, the sealing reliability of the resin 73 for the semiconductor chip 71 is improved.

Above, the embodiment of the present invention has been explained with reference to the figures. It is apparent that the application range of the present invention is not limited to the items shown in the above-mentioned embodiment. In the embodiment, the external terminals were formed by applying solder balls formed in a separate process. However, the external terminals may be formed on the copper bumps by other methods, for example, by directly forming stud bumps on the copper bumps.

As mentioned above, according to the present invention, the resin sealing reliability can be improved in the manufacturing of a so-called wafer-level CSP.

Also, a planarization technique of a mounting surface with favorable yield is realized at high precision by a method that grinds a resin and exposes conductive supports.

What is claimed is:

1. A method for manufacturing a semiconductor device comprising:

preparing a wafer having a surface on which there are several semiconductor elements with corresponding electrode pads exposed on the wafer surface;

forming wiring for electrically connecting each above-mentioned electrode pad to a corresponding one of plurality of external terminals;

forming conductive supports at each point of the above-mentioned wiring where the above-mentioned external terminals are to be connected;

forming a groove in the surface of the above-mentioned wafer along boundary lines of the above-mentioned semiconductor elements, exposing at least said groove, which has an opening width that is wider than a width of a dicing cut, and end surfaces of the above-mentioned conductive supports, covering the surface of the above-mentioned wafer with a resin;

arranging the above-mentioned external terminals on the end surfaces of the above-mentioned exposed conductive supports; and sawing the above-mentioned wafer along the boundary lines of the above-mentioned semiconductor elements, wherein a side wall opposite the above-mentioned groove is inclined at a prescribed angle to a line perpendicular to the surface of the above-mentioned wafer.

2. The method of claim 1, wherein the above-mentioned groove has an approximately V shape.

3. The method of claim 1, wherein the opening angle of the side wall opposite the above-mentioned groove is in the range of 20–45°.

4. The method of claim 3, wherein the step for covering the wafer surface with the resin includes applying and curing the resin to the wafer surface in an approximately flat manner and grinding the surface of the cured resin to expose the end surfaces of the conductive supports.

5. The method of claim 3 further comprising forming an elastic resin layer on the wafer surface before the process for forming the wiring.

6. The method of claim 5, further comprising removing the elastic resin layer along the boundary lines of the semiconductor devices after the process for forming the elastic resin layer.

7. The method of claim 1, wherein a depth of the above-mentioned groove is in the range of 100–300 μm.

8. The method of claim 1, wherein the step for covering the wafer surface with the resin includes applying and curing the resin to the wafer surface in an approximately flat manner and grinding the surface of the cured resin to expose the end surfaces of the conductive supports.

9. The method of claim 1, further comprising forming an elastic resin layer on the wafer surface before the process for forming the wiring.

10. A method for manufacturing a semiconductor device comprising:

preparing a wafer having a surface on which there are several semiconductor elements with corresponding electrode pads exposed on the wafer surface;

forming wiring for electrically connecting the above-mentioned electrode pads to corresponding external terminals on the above-mentioned wafer;

forming conductive supports at each point of the above-mentioned wiring where the above-mentioned external terminals are arranged;

forming an approximately V shape groove in the surface of the above-mentioned wafer along boundary lines of the above-mentioned semiconductor elements, exposing at least said groove which has an opening width that is wider than a width of a dicing cut, and end surfaces of the above-mentioned conductive supports, and wherein a side wall opposite the above-mentioned groove is inclined at a prescribed angle to a line perpendicular to the surface of the above-mentioned wafer;

covering the surface of the above-mentioned wafer with a resin;

arranging the above-mentioned external terminals on the end surfaces of the above-mentioned exposed conductive supports; and sawing the above-mentioned wafer along the boundary lines of the above-mentioned semiconductor elements.

11. The method of claim 10, wherein an opening angle of the side wall opposite the above-mentioned groove is in the range of 20–45°.

12. The method of claim 11, wherein a depth of the above-mentioned groove is in the range of 100–300 μm.

13. The method of claim 10, wherein the step for covering the wafer surface with the resin also includes applying and curing the resin to the wafer surface in an approximately flat manner and grinding the surface of the cured resin to expose the end surfaces of the conductive supports.

14. The method of claim 13 further comprising forming an elastic resin layer on the wafer surface before the process for forming the above-mentioned wiring.

15. The method of claim 10 further comprising forming an elastic resin layer on the wafer surface before the process for forming the above-mentioned wiring.

16. The method of claim 11 further comprising forming an elastic resin layer on the wafer surface before the process for forming the above-mentioned wiring.

* * * * *